United States Patent [19]

Hashimoto et al.

[11] Patent Number: 4,922,334
[45] Date of Patent: May 1, 1990

[54] COLOR FILTER ARRANGEMENT FOR AN IMAGE PICKUP DEVICE HAVING COMPLEMENTARY COLOR ELEMENTS WHICH OVERLAP AT BOUNDARIES BETWEEN PICTURE ELEMENTS

[75] Inventors: Seiji Hashimoto, Kanagawa; Takao Kinoshita, Tokyo; Tsutomu Takayama; Toshio Kaji, both of Kanagawa, all of Japan

[73] Assignee: Canon Kabushiki Kaisha, Tokyo, Japan

[21] Appl. No.: 259,428

[22] Filed: Oct. 17, 1988

Related U.S. Application Data

[63] Continuation of Ser. No. 946,117, Dec. 23, 1986, abandoned, which is a continuation of Ser. No. 857,528, Apr. 23, 1986, abandoned, which is a continuation of Ser. No. 482,159, Apr. 15, 1983, abandoned.

[30] Foreign Application Priority Data

Apr. 12, 1982 [JP] Japan ................................... 57-60819
Apr. 12, 1982 [JP] Japan ................................... 57-60820

[51] Int. Cl.$^5$ ............................................. H04N 9/077
[52] U.S. Cl. ......................................... 358/44; 358/43
[58] Field of Search ........................ 358/44, 41, 43, 48

[56] References Cited

U.S. PATENT DOCUMENTS

| 4,286,285 | 8/1981 | Rhodes | 358/44 |
| 4,288,812 | 9/1981 | Rhodes | 358/44 |
| 4,395,629 | 7/1983 | Sasano et al. | 358/44 |
| 4,437,112 | 3/1984 | Tanaka et al. | 358/44 |
| 4,567,510 | 1/1986 | Tanaka et al. | 358/44 |
| 4,630,106 | 12/1986 | Morimura et al. | 358/44 |

FOREIGN PATENT DOCUMENTS

| 52-71942 | 6/1977 | Japan | 358/44 |
| 56-36286 | 4/1981 | Japan | 358/44 |
| 56-120281 | 9/1981 | Japan | . |
| 57-4680 | 1/1982 | Japan | 358/44 |

Primary Examiner—James J. Groody
Assistant Examiner—Randall S. Svihla
Attorney, Agent, or Firm—Toren, McGeady & Associates

[57] ABSTRACT

A color filter arrangement having complementary color filters for mounting on an image pickup having a plurality of picture elements. The color filters are arranged to overlie respective picture elements and are further arranged to overlap each other over boundaries between respective picture elements with widths wider than the boundaries between the respective picture elements, thereby offsetting any misalignment of the filter arrangement during cementing. Also, an image pickup device including an image pickup arrangement for converting an optical image into electrical image information, the pickup arrangement having a plurality of picture elements including first and second picture elements, and the pickup device further including a color filter member at least consisting of a first part which is provided for the first picture element.

19 Claims, 8 Drawing Sheets

F I G. 5(a)
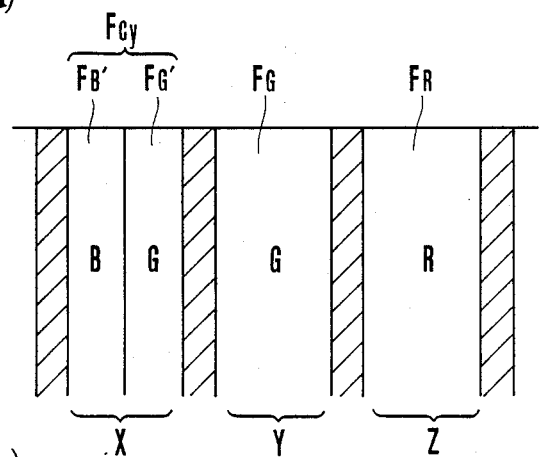
F I G. 5(b)
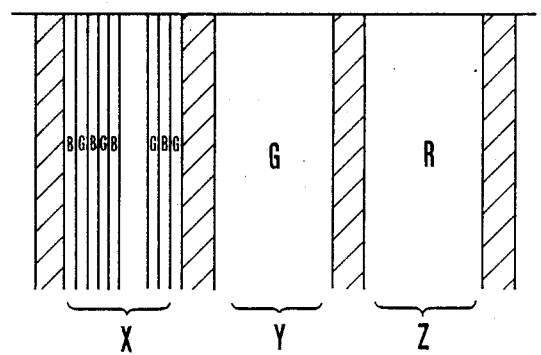

| CELL | C1 | C2 | C3 | C4 | C5 | C6 |
|---|---|---|---|---|---|---|
| STORED ELECTRIC CHARGE | G | Cy+△G | Ye+△G | G | Cy+△G | Ye+△G |

| F1 | F2 | |
|---|---|---|
| Cy | Ye | ---- (1) |
| Cy | Ma | ---- (2) |
| Ye | Ma | ---- (3) |

COLOR FILTER ARRANGEMENT FOR AN IMAGE PICKUP DEVICE HAVING COMPLEMENTARY COLOR ELEMENTS WHICH OVERLAP AT BOUNDARIES BETWEEN PICTURE ELEMENTS

This is a continuation of Ser. No. 946,117, filed Dec. 23, 1986, abandoned, which in turn is a continuation of Ser. No. 857,528, filed Apr. 23, 1986, abandoned, which in turn is a continuation of Ser. No. 482,159, filed Apr. 5, 1983, abandoned.

BACKGROUND OF THE INVENTION

1. Field of the Invention

This invention relates to an image pickup device having an improved arrangement of color separation filters.

2. Description of the Prior Art

In the conventional image pickup devices where, for example, a solid-state image scanner having 384 elements in the horizontal direction and 490 elements in the vertical direction thereof is applied to a monochrome camera, the horizontal read-out clock frequency fc of the solid-state image scanner corresponds to 2 fsc=7.16 MHz of a color sub-carrier frequency fsc with the frequency fsc 3.58 MHz. Since an image of an object to be photographed coming via a picture taking optical system such as a lens is to be sampled at the horizontal read-out clock frequency, horizontal resolution can be obtained to an extent corresponding to a Nyquist frequency fN (fc/2=3.58 MHz). This is thus sufficient for horizontal resolution in currently available TV receivers. If such an image scanner is provided for each of the colors including red (R), green (G) and blue (B) to form a three-plate type color camera, the camera would be capable of giving resolution and color reproducibility for high picture quality such as in a three-tube type color camera.

However, in a three-plate type color camera, it is difficult to reduce the size thereof because the structural arrangement and adjustment of a tri-color separation optical system thereof is complex. Another problem with this type of color camera is that cost reduction to a substantial degree is hardly possible. In view of these problems, it is necessary, for home use, to develop some single-plate type color camera that has a single solid-state image scanner. An attempt to develop a color camera of that type encounters unsolved problems. Consider a problem relative to resolution. A color camera, of course, requires three primary color signals including a red signal, a blue signal and a green signal. In the single-plate type color camera, therefore, the three primary colors must be suitably distributed. In distributing the three primary colors, color separation filters are used in accordance with known methods which can be roughly divided into a mosaic filter method, which is called the Bayer arrangement, and a stripe method in which filters of the same color are arranged in the vertical direction of the solid-state image scanner.

FIG. 1 of the accompanying drawings schematically illustrates a color separation filter of the R, G and Cy stripe type. When the stripe filter of R, G, Cy is used and the clock frequency fc is 7.16 MHz as mentioned above, a sampling frequency for each color in the horizontal direction becomes ⅓ fc=2.4 MHz. Then, the bandwidth color of the chrominance signal becomes about 1.2 MHz. Therefore, a luminance signal obtained from this chrominance signal would result in a horizontal resolution which is about ⅓ of a monochrome camera giving poor picture quality.

In order to obtain from the R, G and B stripe type camera, a horizontal resolution comparable with that of the three plate type, the number of horizontal elements of the image scanner must be greatly increased. However, it is extremely difficult to approximately triple the number of elements in the horizontal direction even with the current LSI technology. In view of this difficulty, Japanese Patent Laid-Open Application No. Sho 56-120281 (or No. 120281-81) has disclosed a method wherein the number of horizontal elements is increased by about 50% and up to about 570 with a color separation filter such as the filter shown in FIG. 1. This method is characterized in that the color separation filter is placed in a stripe type filter arrangement consisting of colors including red (R), green (G) and a cyan color Cy (Cy=B+G). The filter is arranged such that, when a picture of a white object is taken, the ratio of the level of each signal corresponding to a light passing through each of the filters including an R filter FR, a G filter FG and a Cy filter Fcy becomes 1:1:1. With the filter arranged in this manner, a luminance signal is obtained directly from each color or chrominance signal for improved horizontal resolution. However, this prior art method is based on the presumption that picture taking objects generally have a low degree of saturation.

Referring to FIG. 2(a), in the above prior art method, a low saturation object is considered to be about the same as a monochromatic object and, thus, a sampling frequency is equivalently considered to be fc=10.7 MHz even for a chrominance signal. It is thus assumed that the luminance signal band is attainable up to fnl=fc/2. However, this method has the shortcoming that a folding noise occurs if the saturation of the object is high.

When an image of a monochromatic object (for example, a red flower) is taken, assuming that the frequency spectrum distribution of a baseband signal is as represented by a curve A in FIG. 2(b) and that the signal is limited by a band filter LPF1 of FIG. 2(a), the sampling frequency becomes ⅓ fc because it is dependent solely upon the red signal in this case. Then, in the output signal of a solid-state scanner, there appears a primary sideband signal B, etc., at the baseband signal (the curve A) at ⅓ fc. However, since a low-pass filter LPF1, which is used for obtaining a luminance signal, is a wide band as shown in FIG. 2(b), a component obtained by multiplying the sideband portion, indicated by hatching in FIG. 2(b), by the curve of the filter LPF1 appears as a folding noise, which seriously degrades the picture quality.

The color reproducibility of the above method has the following problem: Referring to FIG. 3(a), the spectral sensitivity characteristic of a stripe filter, which is composed of filters FR, FG and Fcy as shown in FIG. 3(a), is limited by an infrared cut filter. The sensitivity of the filter for a cyan color light is limited by the spectral sensitivity characteristic CCD. Therefore, the overall spectral sensitivity distribution of the image pickup device must have uniform sensitivity distribution for all of the colors including red, green and a cyan color by presetting and adjusting the transmission factor of each of the color filters.

In an image pickup device of the above R, G and Cy type, a signal SB for a blue color is obtained by subtracting a signal SG, which corresponds to a light which has passed through the green filter FG, from a signal Scy, corresponding to a light which has passed through the filter Fcy of the cyan color. Therefore, the spectral sensitivity distribution of the cyan color filter must be a composition of the sensitivity distribution of the blue color filter and that of the green color filter, as shown in FIG. 3(b), while in overall sensitivity, it must be the same as red and green. Conventional cyan color filters have sensitivity distributions as shown in FIG. 3(a). Therefore, the blue signal SB, which is obtained through the above correlating process, is different from the signal which is normally obtainable from the blue color filter. This results in a serious deterioration of color reproduction.

Let us now consider the cementing precision of the image scanner and the color separation filter. There are different kinds of known image scanners including an interline type CCD (IL type), a frame transfer type CCD (FT type), an MOS type, etc. However, the FT type CCD is used in the following description:

FIG. 4 is an enlarged view showing a portion of the image pickup part (or a photoelectric transducer) of the FT type CCD. The details will be described later herein. In FIG. 4, channel stoppers 3 prevent electric charge between horizontal directional elements from dispersing. To this part is applied and cemented the color separation filter which is shown in FIG. 1. There is provided light shielding layers LS for preventing incident light from passing through. The color separation filter consists of filter parts Cy, R and G which allow, respectively, a Cy light, an R light and a G light to pass therethrough. The channel stoppers normally measures 2 to 3 μm in width while the light shielding layers LS are the same width as the channel stoppers. The filter is cemented with the channel stoppers and the light shielding layers LS in superposition with each other. However, it is extremely difficult to increase the cementing precision because of mechanical error of cementing, the dimensional error of the image pickup element, that of the filter, etc. In addition, the color separation filter tends to be moved by adhesive's tension unevenness which arises during the stiffening process of an adhesive. If a cementing error causes, for example, the G filter part to overlap the image pickup element part of the R filter, a chrominance signal, which is to be ultimately obtained, would represent a mixed color which deteriorates color reproducibility.

Meanwhile, it is preferable to reduce the width of the light shielding layer LS of the color separation filter as much as possible. This is because the channel stopper has a certain degree of light sensitivity. Therefore, it is desired to increase sensitivity of the camera as a whole by increasing the (light receiving) aperture efficiency of the image pickup element through the reduction of the width of the light shielding layer LS.

As has been described in the foregoing, the conventional color separation filters have had many shortcomings in terms of resolution, color reproducibility, cementing precision, etc.

SUMMARY OF THE INVENTION

It is an object of the present invention to provide an image pickup device having an improved filter arrangement which obliterates the shortcomings of the prior art mentioned in the foregoing.

To attain this object, the device according to the invention has many filters used as color filters for forming complementary colors in such a manner that the virtual sampling frequency can be increased even for an object of high saturation so that the folding noise mentioned in the foregoing can be lessened. It is another feature of the invention that a filter for forming a specific color is composed of a plurality of color filters.

For example, instead of using a Cy filter, a B filter and a G filter are used for different regions of the same picture element in such a manner that the spectral characteristic of the Cy filter can be set as desired by this arrangement. Therefore, this permits correct color reproduction in accomplishing a correlating process with signals from other picture elements.

Furthermore, in accordance with the invention, the color filter for a specific color is composed of small divided color filters of different kinds, so that false signals are seldom produced even for an object of high spatial frequency.

In forming the filter for a specific color with a plurality of different color filters, optimum correlation with other picture elements can be obtained by adjusting the ratio of the area coupled by each color filter to the whole area. Thus, while, according to the prior art, it is impossible to equalize the levels of individual picture element signals, the present invention makes it quite easy to equalize the levels of such signals.

Furthermore, according to a specific embodiment of the invention, in arranging a color filter for a prescribed color in front of a prescribed picture element, the filter of this color is composed of a plurality of color filters and the peripheral part of the picture element is covered by filters of a prescribed common color, so that any cementing error of the filters for the image pickup element can be effectively offset by virtue of the common color filters.

With the common color filter thus covering the area around the edge of the picture element in a specific direction, the aperture efficiency of the picture element can be increased for improved sensitivity. Besides, since this arrangement serves to cut the high frequency component of the picture taking object to some extent, it contributes to folding noise reduction.

In accordance with the invention, a chrominance signal of a prescribed spectral characteristic is obtained by arranging a plurality of complementary color filters at least for some of the picture elements. Therefore, setting of the spectral characteristic can be facilitated by the arrangement.

Furthermore, in that instance, the complementary color filters overlap each other to prevent false signals from occurring.

The above and further objects and advantageous features of the invention will become apparent from the following detailed description of preferred embodiments thereof taken in conjunction with the accompanying drawings.

BRIEF DESCRIPTION OF THE DRAWINGS

FIGS. 5(a) to 5(g) illustrate the arrangement of filters in the present invention in the first through the seventh embodiments.

DETAILED DESCRIPTION OF THE PREFERRED EMBODIMENTS

Figure 4:
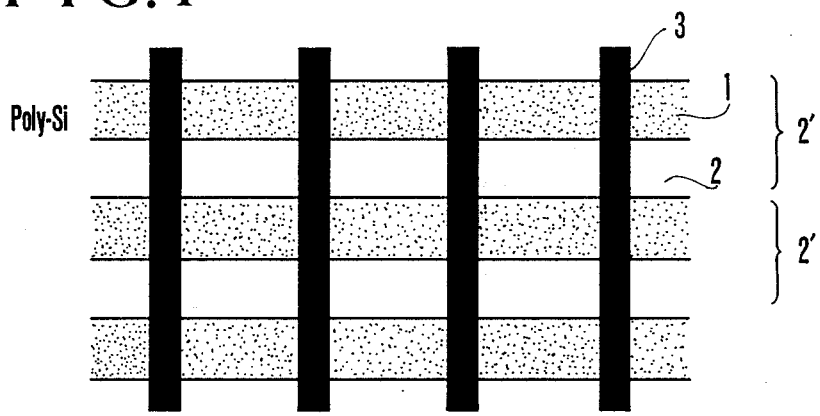
FIG. 4 illustrates, by way of example, the structural arrangement of an image pickup element to which the present invention is applicable.

Referring to FIG. 4, which shows the arrangement of essential parts of a frame transfer type CCD as an example of image pickup means according to the present invention, the reference numeral 1 identifies transferring transparent electrodes made of poly silicon. The reference numeral 3 identifies channel stoppers. A filter is adjusted to the positions of picture elements so that light shielding parts are positioned over the channel stoppers 3 in the horizontal direction of this image pickup element or means. Reference numeral 2 identifies virtual electrode parts, each of which constantly form a prescribed potential well with treatment such as ion injection or the like applied thereto. Reference numeral 2' identifies picture elements, each of which consists of the transparent electrode part 1 and the virtual electrode part 2.

Figure 1:
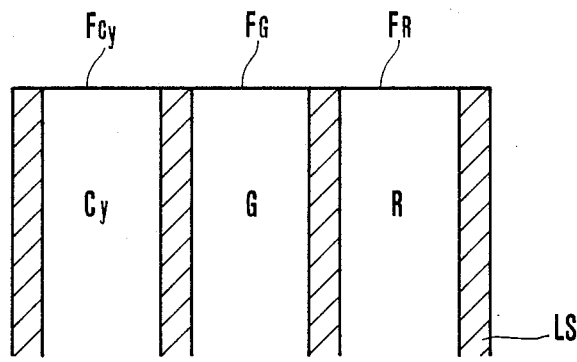
FIG. 1 is a schematic illustration showing the structural arrangement of a strip filter of the conventional R, G and Cy type.
Figure 2:
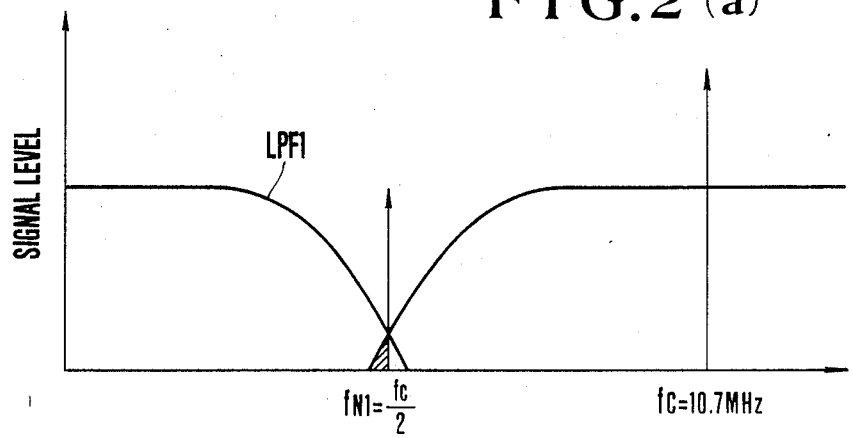
FIGS. 2(a) and 2(b) are schematic illustrations showing the folding noise of the filter shown in FIG. 1.
Figure 2:
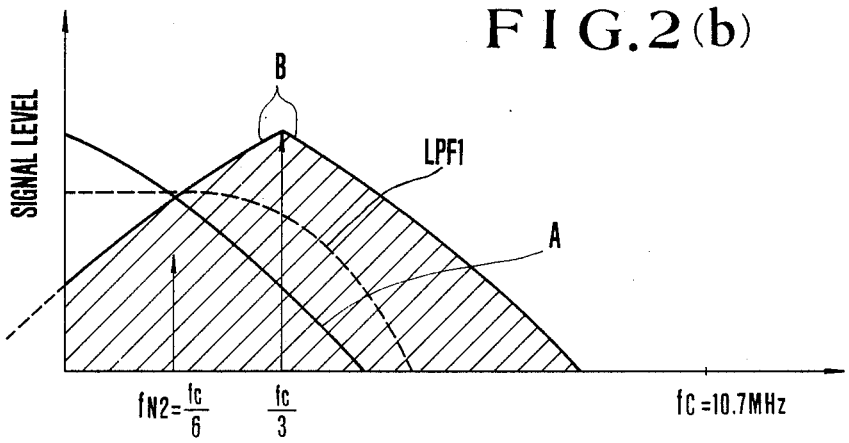
Figure 3:
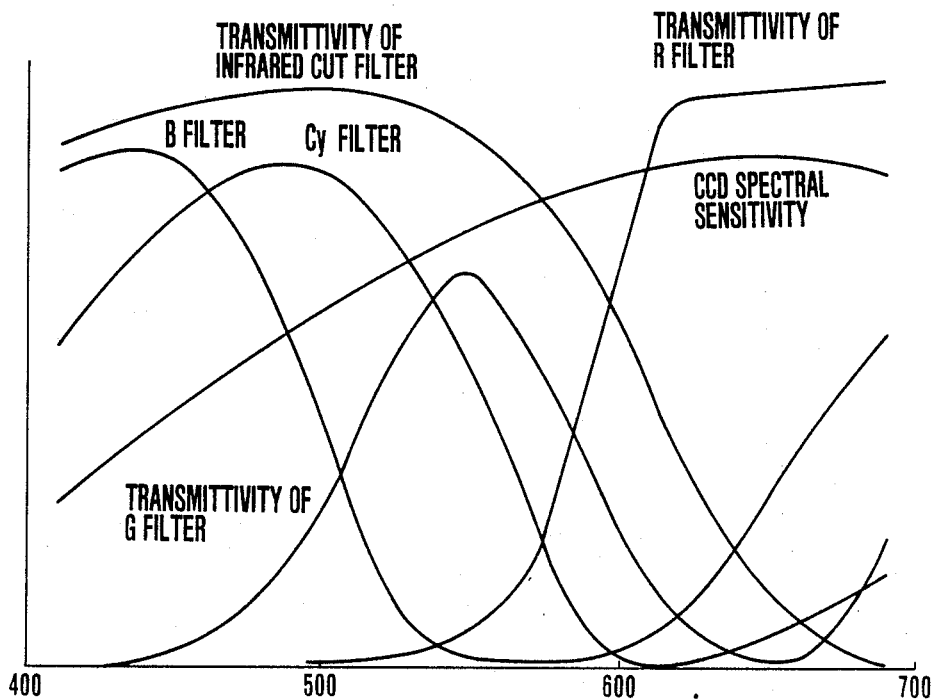
FIGS. 3(a) and 3(b) are illustrations of the spectral characteristic of color filters.
Figure 3:
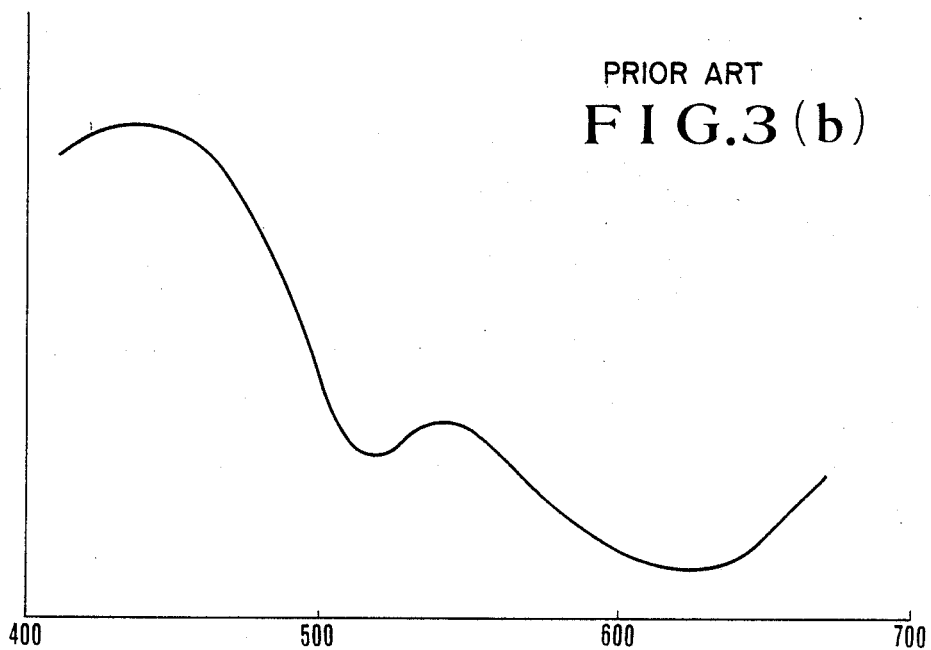

FIGS. 5(a) to 5(g) respectively show the arrangement of color separation filters as filter means according to the invention and in the first through the seventh embodiments thereof. Of these embodiment examples, FIGS. 5(a) to 5(e) show embodiments in which the invention is applied to the R, G and Cy type. In these cases, a cyan color filter Fcy is formed by a combination of a B filter and a G filter. In these drawings, reference symbols FB identify blue filters which serve as a third part according to the invention; green filters FG' and FG have the same spectral sensitivity and serve as first and second parts according to the invention; and a red filter is identified by the reference symbol FR. The illustrated combination is arranged in a regularly repeating manner. In other words, instead of using a cyan color filter Fcy, the green color filter FG', which has the same spectral sensitivity as the green color filter FG, and a blue color filter FB', which has such sensitivity distribution for a blue color as shown in FIG. 3(a), are adjacently arranged side by side on a second picture element X according to the invention. Meanwhile, the filter FG, which serves as the first part, is provided for a first picture element Y. Accordingly, the spectral sensitivity characteristic of the filter composed of the combination of the filters FG' and FB' is compounded with the spectral sensitivity characteristic of the green color filter and that of the blue color filter of FIG. 3(a) in the ratio of areas of the filters FG' and FB', so that an ideal sensitivity distribution for a cyan color can be obtained as shown in FIG. 3(b). As for a third picture element Z, the filter FR is provided as a fourth filter part. When this color filter is used for an image pickup device, the color reproducibility of the device becomes excellent. Furthermore, it goes without saying that, in accordance with the invention, the order of arrangement of the filters Fcy, FG and FR and the order of the filters FB' and FG' are not limited to the illustrated order.

In the embodiment examples shown in FIGS. 5(b)–5(e), the cyanic color filter is formed by a repeating pattern of many G filters and B filters. The filter is formed into a vertical stripe shape in the case of FIG. 5(b), into a horizontal stripe shape in the case of FIG. 5(c), into a mosaic shape in the case of FIG. 5(d) and into a more finely divided mosaic shape in the case of FIG. 5(e). In the embodiment shown in FIG. 5(f), the present invention is applied to a mosaic filter which is usable for an inter-line type CCD or the like. In this case, the cyan color filter is also formed jointly by the B filter and the G filter.

While, in all the embodiment examples described above, the cyan color filter is composed of the pure blue color filter B and the pure green color filter G, it is to be understood that the invention is not limited to such colors but is also applicable to filters of any complementary colors.

For example, instead of using a white filter, a suitable combination of red (R), green (G) and blue (B) filters may be used in place of the white filter.

Figure 5C:
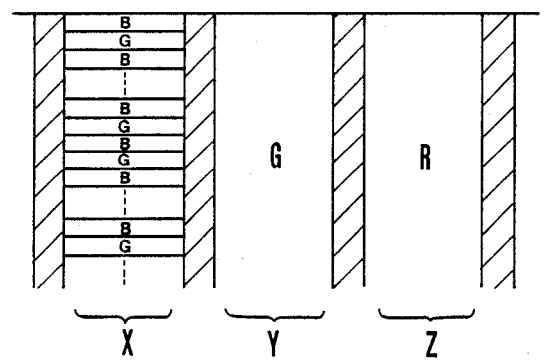
Figure 5D:
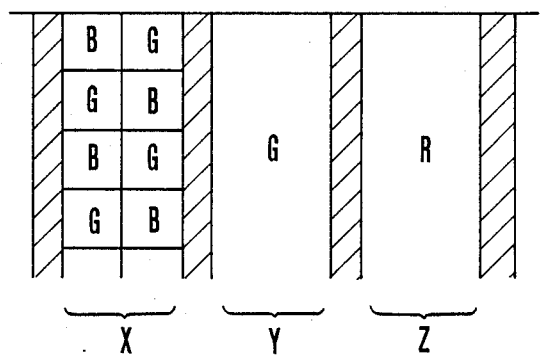
Figure 5E:
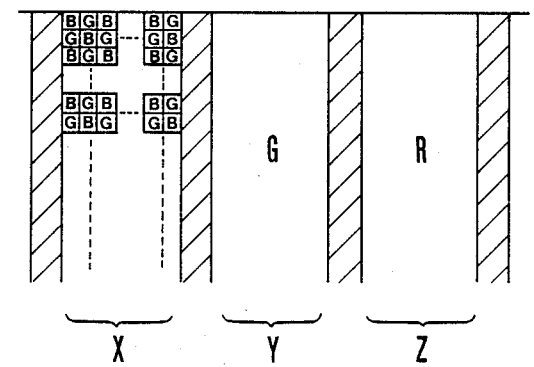
Figure 5F:
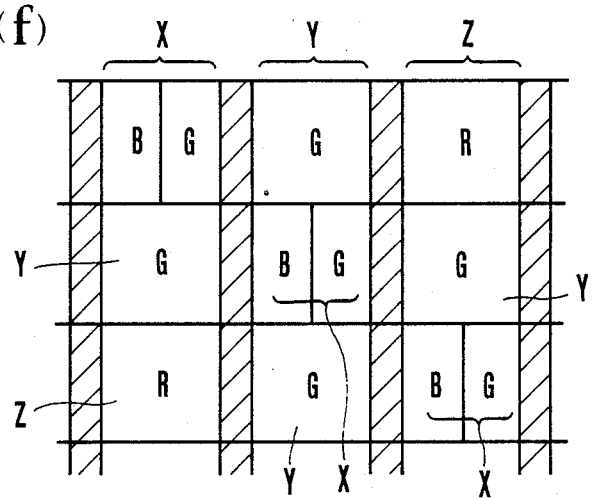
Figure 5G:
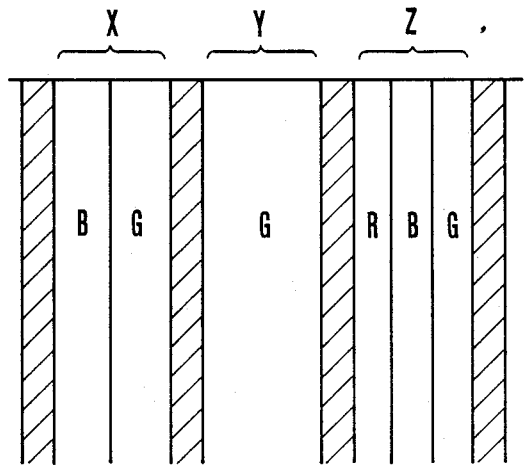

FIG. 5(g) shows, by way of example, a filter arrangement including such a transparent filter. In this case, a cyan color filter is provided for a picture element X, a green or G filter for a picture element Y and a white color filter for the picture element Z.

Figure 5H:
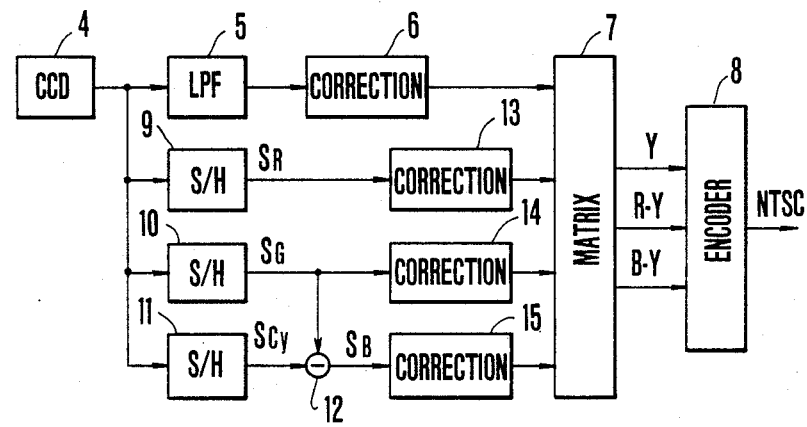
FIG. 5(h) is a block diagram showing, by way of example, a signal processing circuit.

As apparent from these embodiment examples described above, in accordance with the present invention, setting of the spectral characteristic of complementary color filters can be very simply accomplished. Therefore, when the outputs of adjacent picture elements are operated in a correlating process, the color reproducibility of the image pickup device can be greatly improved. Referring to FIG. 5(h), which shows, by way of example, the arrangement of a circuit for processing a picture signal obtained from the invented filter arrangement shown in the drawings from FIG. 5(a) through FIG. 5(e), the circuit arrangement includes image pickup means 4 which is in combination with the above-stated filter arrangement; a low-pass filter 5 which cuts the high frequency component of the dot sequential outputs of the image pickup means 4; a correction circuit 6 which performs various kinds of correction such as γ correction, aperture correction, etc., for pseudo γ signals produced from the low-pass filter 5; sample-and-hold circuits 9 to 11 which sample hold the color components of R, G and Cy, respectively; and a subtractor 12 which serves as processing means according to the invention. The subtractor 12 subtracts the output of the sample-and-hold circuit 10 from the output of the sample-and-hold circuit 11 to form thereby a signal corresponding to a B component. In accordance with the invention, the Cy filter is composed of a combination of a B filter and a G filter, with the G filter having the same spectral characteristic as that of the G filter which is provided for the picture element which generates a G component as previously discussed.

Therefore, a false color signal is seldom produced in the B component as the output of the process circuit or subtractor 12. The circuit arrangement further includes correction circuits 13, 14 and 15 which respectively make various kinds of corrections in about the same manner as the above-stated correction circuit 6; a matrix circuit 7 which is arranged to form a γ signal and color difference signals R-Y and B-Y from color or chrominance signals and the pseudo luminance signal γ; and an encoder 8 which modulates the signal γ and the color difference signals into standard television signals, such as NTSC signals. Furthermore, standard television signals are also obtainable from the filter arrangement of FIGS. 5(f) and 5(g) in the same manner as in this embodiment.

Figure 6:
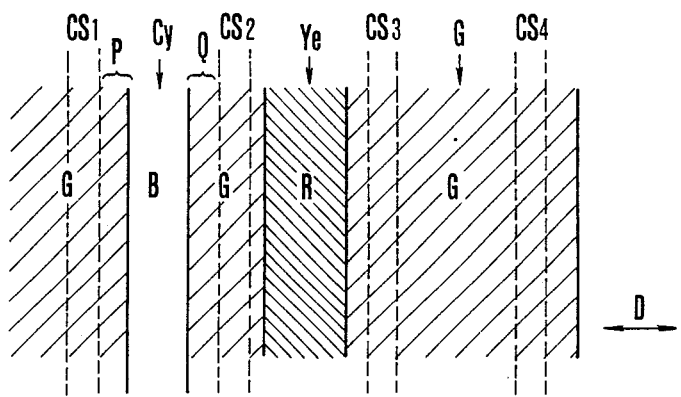
FIG. 6 is an illustration of a filter according to the invention in an eighth embodiment.

An eighth embodiment of the invention is shown in FIG. 6. In this embodiment, a color filter for a prescribed color consists of a plurality of color filter parts including second and third color filter parts. The second color filter part is at the boundary of the filter adjoining another filter or in the vicinity of the boundary of the color filter. In this specific example, the following description of the embodiment deals with a color separation filter comprising, in combination, a Cy filter, a yellow (Ye) filter and a G filter.

In FIG. 6, reference symbols CS1–CS4 indicate channel stoppers of the CCD in the rear of the filter. As shown, a second picture element X, which is disposed between the channel stoppers CS1 and CS2, is covered by the third filter part B and the second filter part G. As a result of this arrangement, an output, which is equivalent to an output which would be obtained by covering the picture element with the Cy filter, is obtainable. Meanwhile, the G filter, which serves as a first filter part, is, for the first picture element γ, disposed between the channel stoppers CS3 and CS4. Using the picture element between the channel stoppers CS1 and CS2 as an example, the opposite end parts of the picture element in the horizontal direction, i.e., the channel stoppers CS1 and CS2 and parts P and Q adjoining the stoppers CS1 and CS2 are covered by the G filters serving as second filter parts. Therefore, even if the position of the color separation filter happens to somewhat deviate in the direction of arrow D, the total area of the G filters over the peripheral parts P and Q of the picture element remains unchanged. Hence, some positional deviation when the filter is in front of the image pickup element results in no adverse effect. The filter part for a color Ye and the G filter part are also arranged in the same manner and have the same advantage.

In other words, the G filter covers the channel stoppers CS3 and CS4. Therefore, the output of the picture element between the channel stoppers CS3 and CS4 would remain completely unaffected by any minor positional deviation of the filters G. This permits use of an adhesive in a layer which is thicker than that which is conventionally used for securing the color separation filter to the image pickup element in the manufacturing process. Besides, color mixing never takes place even when the pupil position of a picture taking lens is closer.

Heretofore, in cementing a filter to the CCD or the like with an adhesive, it has been necessary to limit the thickness of the adhesive layer to a value not exceeding 10 μm because if the thickness exceeds this value, a space between the filter and the CCD would bring about crosstalk unless a large aperture lens having a pupil position at a greater distance is used. This embodiment of the invention solves this problem by eliminating any crosstalk. The embodiment thus permits use of a small picture taking lens. In addition, another advantage of this embodiment is that the cementing error between the filter and the image pickup element due to the unevenness of tension, which arises during a setting period of the adhesive, can be ignored.

Furthermore, it has been ascertained that the filter cementing precision, which has heretofore been required to be less than 0.5 μm, becomes tolerable up to 3 to 4 μm in accordance with the present invention which increases mass production and yield. Besides, the structural arrangement according to the invention lessens the possibility of color mixing and balance deviation.

Figure 7A:
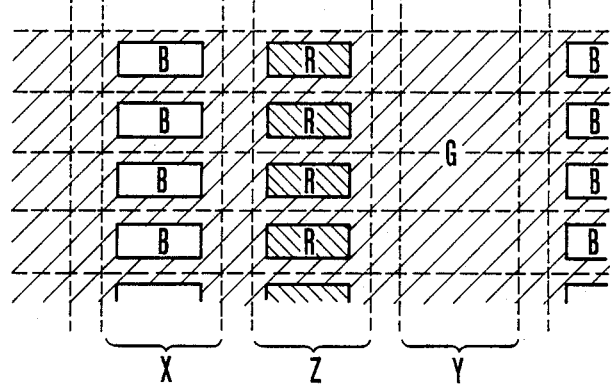
FIG. 7(a) illustrates a ninth embodiment of the invention.

Referring now to FIG. 7(a) which shows a color separation filter in a ninth embodiment of the invention, the filter is arranged as follows: The boundaries and peripheral parts of all component filters have the color of either the first or second filter part in common. With this arrangement, it is possible to offset the positional deviation of the filter not only in the horizontal direction but also in the vertical direction.

Figure 7B:
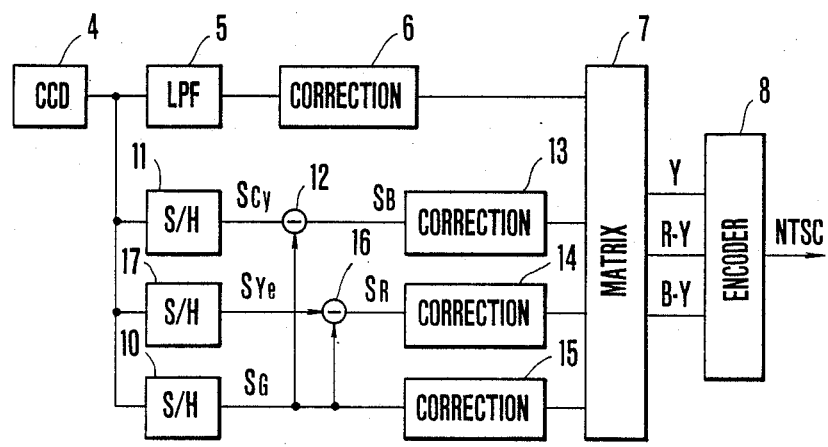
FIG. 7(b) is a block diagram showing another example of a signal processing circuit arrangement.

FIG. 7(b) shows, by way of example, a signal processing circuit suited for the filter arrangements of FIGS. 6 and 7(a). In this drawing, the parts identical to those shown in FIG. 5(h) are indicated by the same reference numerals as those used in FIG. 5(h). The signal processing circuit includes a subtractor 16 which serves as processing means according to the invention. The subtractor 16 forms an R signal by subtracting the G component signal, which is obtained as the output of the sample-and-hold circuit 10, from the Ye component signal. The Ye component signal is obtained as the output of a sample-and-hold circuit 17.

An advantage of this embodiment is that false signals are seldom produced with the filter arranged as illustrated in FIGS. 6 and 7(a).

Furthermore, it goes without saying that, instead of attaching the filter by an adhesive, the filter G may be formed directly on the image pickup element for further improvement in mass production.

With color filters in place of light shielding parts on the channel stoppers CS1–CS4 as in these examples, aperture efficiency is enhanced.

Another advantage is that the sensitivity of the channel stoppers CS1–CS4 can be effectively utilized. A further advantage is that the use of G filters as color filters on the channel stoppers CS1–CS4 increases the ratio of the G component to the whole filter arrangement and this results in excellent resolution. Furthermore, this embodiment results in excellent color reproduction.

In the foregoing description, the invention is described as applied to a frame transfer (FT) type CCD. However, it should be understood that the invention is applicable also to the inter-line and the MOS types without any difficulty.

Figures 8A, 8B, 8C:
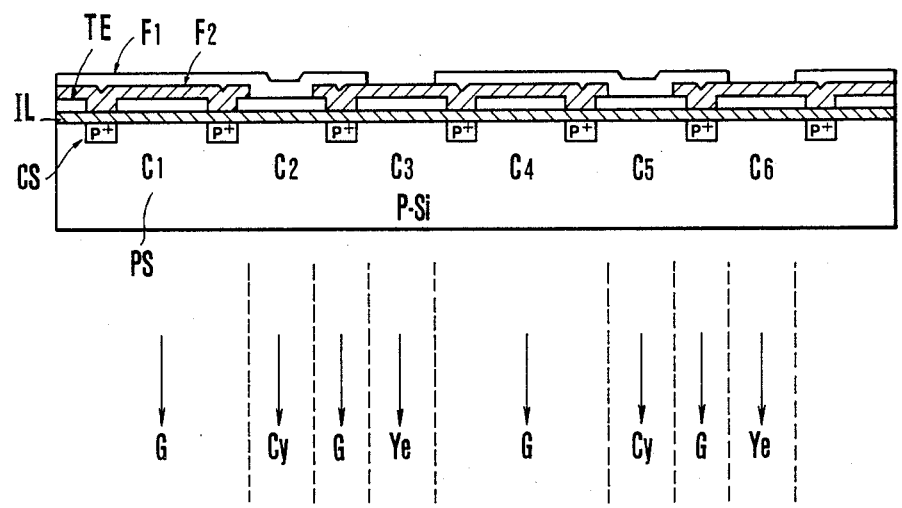
FIG. 8(a) is a schematic illustration of a filter in accordance with the invention in a tenth embodiment thereof.
FIG. 8(b) is an illustration of an electric charge stored at each light sensitive region in the tenth embodiment of the invention.
FIG. 8(c) shows different filter combinations in a tenth embodiment.

A tenth embodiment of the invention is as shown in FIG. 8(a). A plurality of color filters are provided, at least for some of the picture elements, with these color filters partially overlapping each other. The widths of the overlapping portions are wider than the widths of the respective channel stoppers CS, as shown in FIG. 8(a). Referring to FIG. 8(a), each of the channel stoppers CS is prepared by dispersing $p^+$ in a P-type semiconductor substrate. A photosensitive region (or a cell) PS is interposed between the channel stoppers CS. The embodiment includes an insulator layer IL which is made of SiO$_2$ or the like; transparent electrodes TE which control the potential level of the photosensitive region (cell) PS through the insulator layer IL; and color filters F1 and F2 which are combined as shown in FIG. 8(c). FIG. 8(c) shows different combinations (1), (2) and (3) of the color filters F1 and F2. Of these different combinations, the combination (1) is illustrated in FIGS. 8(a) and 8(b).

More specifically, the filters F1 and F2 are assumed to be for the cyan color Cy and the yellow color Ye. Color components pass through the filter arrangement in such a repeating manner as G, Cy, G, Ye, G, Cy, G and Ye, as shown in FIG. 8(a). Therefore, electric charges corresponding to color components G, Cy+ΔG, Ye+ΔG, G, Cy+ΔG, Ye+ΔG are stored at photosensitive regions C1–C6, respectively. In this manner, the cells C1 and C4, which serve as a first picture element, are provided with a first filter part consisting of the filters F1 and F2. Meanwhile, the cells C2 and C5, which serve as a second picture element, are provided not only with a second filter part which also consists of the filters F1 and F2 but also with a third filter part in which the filter F1 is alone included.

The embodiment also has third picture elements formed by the cells C3 and C6. The third picture element is provided with a second filter part consisting of the filters F1 and F2 and a fourth filter part consisting solely of the filter F2. With this arrangement, three kinds of dot sequential color or chrominance signals can be formed merely by combining two color filters.

Since filters of complementary colors are used, sufficient sensitivity is retained even with overlapping filters. If the color separation filter is formed with filters of pure colors, overlapped parts of the filters block the light when their peripheral portions overlap each other. This would result in lower aperture efficiency. Conversely, if there is a void between these pure color filters, such a void would produce a white signal W and this would result in a false signal. On the other hand, in accordance with this embodiment of the invention, such overlapped parts retain a sufficient degree of sensitivity. Besides, compared with a color separation filter which is composed of pure color filters, the embodiment has a higher level of light incident upon each photosensitive region.

Again referring to FIG. 8(c), the combinations (2) and (3), in which the filters F1 and F2 are of a cyan color Cy and magenta Ma, or yellow Ye and magenta Ma, also give the same advantageous effect.

Furthermore, when the filter arrangement uses the combination (1) of FIG. 8(c), the circuit of FIG. 7(b) can be used without any modification by carrying out the sample holding process, which supplies the outputs of the cells (photosensitive regions) C1 and C4 to the circuit element 10 shown in FIG. 7(b), the outputs of the cells C2 and C5 to the circuit element 11, and the outputs of the cells C3 and C6 to the circuit element 17, respectively.

Embodiments 11 through 14 are as shown in the drawings of FIGS. 9 through 12. Varied examples of color filter combinations are shown in FIGS. 9 through 12, in which reference symbols CS and PS respectively indicate channel stoppers and photosensitive regions.

Figure 9:
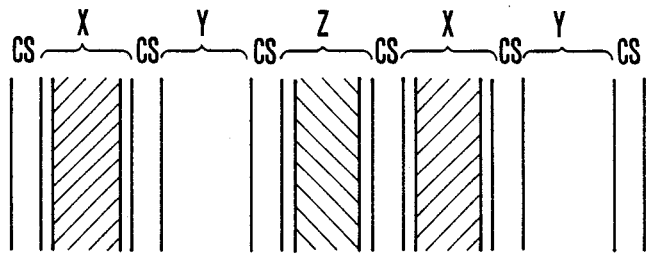
FIGS. 9 to 12 are illustrations of filters according to the invention in the eleventh through the fourteenth embodiments thereof.
Figure 10:
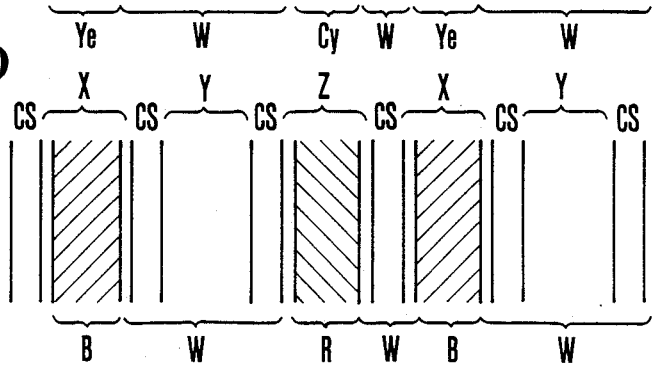
Figure 11:
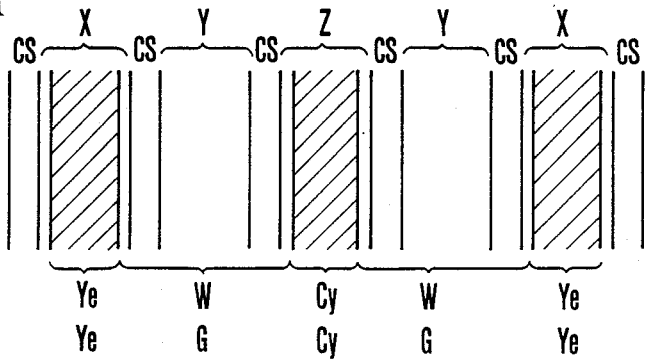
Figure 12:
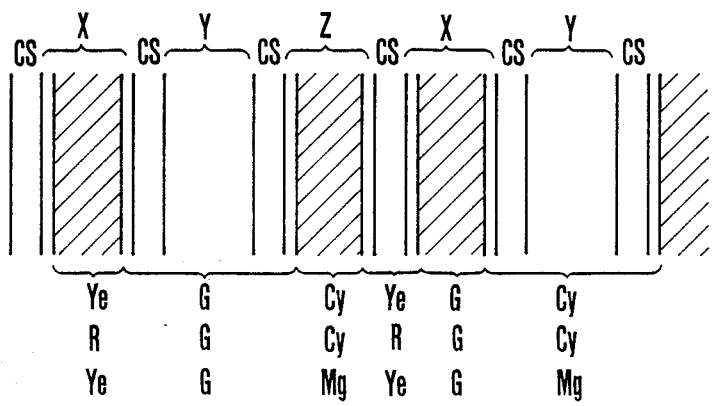

In FIG. 9, a Ye, W (white) and Cy stripe filter arrangement is employed. A white (W) filter is used in the peripheral areas between one color filter and another. The embodiment shown in FIG. 10 employs a B, W and R stripe filter arrangement, wherein peripheral areas between one color filter and another is a W filter. In FIG. 11, the present invention is applied to a Ye, W and Cy or a Ye, G and Cy stripe filter arrangement. FIG. 12 shows the invention applied to a stripe filter arrangement consisting of a combination of color filters Ye, G, and Cy; R, G and Cy; or Ye, G and Ma. In each of these embodiments shown in the drawings of FIGS. 9 through 12, a plurality of complementary color filters are provided at least for some picture elements resulting in improvement in the sensitivity of the filter and that of overlapped parts thereof. In accordance with these filter arrangements, aperture efficiency can be enhanced.

Furthermore, the filter arrangement according to the invention gives high quality color signals including fewer false signals when the filter arrangement is combined with the signal processing circuit which includes processing means, as shown in FIGS. 5(h) or 7(b).

What we claim:

1. An image pickup device comprising:
   (a) image pickup means for converting an optical image into electrical image information, said image pickup means having a plurality of picture elements and including channel stop means for separating said picture elements; and
   (b) a plurality of complementary color filters arranged on said image pickup means to transmit light of predetermined spectral characteristics to each of said picture elements, said plurality of complementary color filters overlapping on the channel stop means in widths wider than said channel stop means.

2. A device according to claim 1, in which said complementary color filters include at least a yellow filter and a cyan filter.

3. An image pickup device comprising:
   (a) image pickup means for converting an optical image into electrical image information, said means having a plurality of picture elements; and
   (b) a plurality of complementary color filters arranged on said image pickup means to transmit light to respective elements of said plurality of picture elements, adjacent filters of said plurality of complementary color filters fully overlapping on every boundary of respective elements of said plurality of picture elements.

4. A device according to claim 3, in which said complementary color filters include at least a yellow filter and a cyan filter.

5. A device according to claim 4, which further comprises separating means for forming the boundaries of the picture elements.

6. A device according to claim 5, in which the separating means includes channel stops.

7. A device according to claim 6, in which said plurality of complementary color filters are overlapping in widths wider than the channel stops.

8. A device comprising:
   (a) a substrate; and
   (b) a plurality of complementary color filters arranged on said substrate, at least one filter of said plurality of complementary color filters overlapping with two adjacent filters of said plurality of complementary color filters.

9. A device according to claim 8, wherein said substrate is a semiconductor.

10. A device according to claim 8, wherein said substrate is composed of a plurality of elements.

11. A device according to claim 10, wherein adjacent filters of said plurality of filters overlap each other on boundaries of respective elements of said plurality of elements.

12. A device according to claim 10, wherein said plurality of filters include at least a yellow filter and a cyan filter.

13. A device according to claim 10, wherein said substrate has separating means for forming the boundaries of said plurality of elements.

14. A device according to claim 13, wherein said separating means includes channel stops.

15. An image pickup device comprising:
(a) image pickup means for converting an optical image into electrical image information, said means having a plurality of picture elements including first and second picture elements; and
(b) color filter means at least consisting of a first part which is provided for the first picture element of said plurality of picture elements and is arranged to transmit a light of a first color, second parts which are provided for the second picture element and are arranged to transmit a light of the first color, and third parts which are provided also for the second picture element and are arranged to transmit a light of a second color differing from the first color, wherein said second and third parts are arranged for said second picture element in a prescribed repeating pattern.

16. An image device according to claim 15, wherein said repeating pattern is a striped pattern.

17. An image device according to claim 15, wherein said repeating pattern is a mosaic striped pattern.

18. An image device according to claim 15, wherein said first color is green.

19. An image pickup device according to claim 15, further comprising:
(c) processing means for forming a prescribed color or chrominance signal by operating on outputs of said first and second picture elements.

* * * * *